United States Patent [19]

Skovran et al.

[11] Patent Number: 4,519,014
[45] Date of Patent: May 21, 1985

[54] CABLE ACCESS ASSEMBLY

[75] Inventors: Daniel G. Skovran, Minnetonka; Brett A. Shockley, Edina; Harvey J. Chouanard, Deephaven, all of Minn.

[73] Assignee: Magnetic Controls Company, Minneapolis, Minn.

[21] Appl. No.: 492,944

[22] Filed: May 9, 1983

[51] Int. Cl.³ .............................................. H05K 7/02
[52] U.S. Cl. .................... 361/397; 174/88 R; 174/93; 361/395
[58] Field of Search ............... 361/331, 380, 395, 398, 361/399, 426, 428, 397; 339/75 P, 75 R; 174/88 R, 93, 41, 135

[56] References Cited

U.S. PATENT DOCUMENTS

| 2,434,102 | 1/1948 | Channell | 174/59 |
| 2,683,304 | 7/1954 | Channell | 29/857 |
| 2,753,536 | 7/1956 | Tjader | 339/75 P |
| 2,891,161 | 6/1959 | Koliss | 174/59 |
| 3,337,775 | 8/1967 | Scoles | 361/380 |
| 3,475,716 | 10/1969 | Laig | 339/75 P |
| 3,617,612 | 11/1971 | Patton | 174/65 R |
| 3,701,835 | 10/1972 | Eisele et al. | 174/41 |
| 3,838,213 | 9/1974 | Georgopulos | 174/46 |
| 3,916,082 | 10/1975 | Gillemot | 174/41 |
| 3,956,672 | 5/1976 | Dumas | 361/331 |
| 3,983,457 | 9/1976 | Smith | 361/380 |
| 4,221,449 | 9/1980 | Shugart | 339/75 P |
| 4,227,236 | 10/1980 | Kübler | 361/331 |

FOREIGN PATENT DOCUMENTS 0004802 10/1979 European Pat. Off. ............ 174/135

Primary Examiner—Harry E. Moose, Jr.
Assistant Examiner—Gregory D. Thompson
Attorney, Agent, or Firm—Dorsey & Whitney

[57] ABSTRACT

An access assembly for a multi-conductor cable including a pair of end members through which the cable extends, a strain relief member connected with and extending between the end members and a tubular member enclosing the end members and strain relief member.

24 Claims, 11 Drawing Figures

CABLE ACCESS ASSEMBLY

BACKGROUND OF THE INVENTION

The present invention relates generally to a cable access assembly and more particularly to a device for facilitating access to the conductors in a multi-conductor cable for the purpose of placing a plurality of resistors or other electrical elements within the conductor circuits of the multi-conductor cable.

Multi-conductor cables containing as many as fifty or more individual wires are used in the communications or data transmissions or processing industries. It is sometimes necessary, when interfacing these multi-conductor cables with certain equipment, to apply a certain resistance or other electronic characteristic within the wires of the multi-conductor cable. One way in which this is presently being accomplished in the prior art is to terminate each of the fifty or more wires of the multi-conductor cable into a termination panel embodying the desired resistances or other electrical elements. Each of the conductors is connected with the panel so that its respective circuit runs through the desired resistance or other electrical element. These resistors or other electrical elements are then connected to the corresponding other end of the conductor. This method is not only time consuming and expensive, but also requires a relatively large amount of valuable space.

In another prior art method, the multi-conductor cable is split and the electrical components wired directly to the cable conductors. A plastic enclosure is then positioned around the electrical components and the ends sealed, after which a plastic sealing material such as an epoxy is poured or injected into the tube and allowed to cure. The molded plastic material disposed around the body of the cable provides a means for relieving strain on the various connections within the cable. Although this method requires much less space than other prior art devices, this latter method virtually eliminates any access to the resistors or other electrical components connected within the cable after the plastic material is cured. Thus, this latter method does not facilitate changing of the resistors or other electrical components, nor does it facilitate access for testing or repair.

Accordingly, there is a need in the art for a device usable with a multi-conductor cable which facilitates the placement of resistors or other electrical elements within the conductor circuit which not only is space efficient, but also facilitates continued access to the conductors for testing, replacement or repair.

SUMMARY OF THE INVENTION

The present invention relates to a device which is usable with a multi-conductor cable and which functions to provide access to the individual conductors in such cable for the purpose of permitting the connection of resistors or other electrical elements within the various conductor circuits. The device of the present invention is space efficient and includes means which permits continued access to the individual conductors and the connected resistors or other elements for the purpose of testing, replacement or repair. Further, the device of the present invention includes means for providing a strain relief upon the multi-conductor cable so that the strain is not exerted on the various resistors or other electrical elements connected within the conductor circuits.

More specifically, the device of the present invention includes a pair of end elements having a centrally positioned opening permitting them to be slipped onto a multi-conductor cable. These end elements are spaced from each other and are disposed on either side of the portion of the multi-conductor cable to which the resistors or other electrical elements are to be connected. Connected to these end elements is a rigid strain relief connecting bar which in the preferred embodiment is made of a rigid metal. In the preferred embodiment, each end of this rigid bar includes a pair of spaced yoke members which are adapted to straddle the end members so as to retain the connecting bar in a fixed position with respect to the end elements. The device also includes an elongated piece of printed circuit board or other similar member for mounting the resistors or various other electrical elements. In the preferred embodiment, the plurality of resistor units, each of which includes several individual resistor elements, are mounted on the printed circuit board and are then connected with the various wires in the multi-conductor cable. The elongated printed circuit board section is connected with opposite ends of the cable by a pair of connector straps. A tubular member is slipped over the entire unit and retained with respect to the strain relief bar and the pair of end members by a pair of threaded screws or the like.

In the event access to the resistors or other components is not necessary or desired, the strain relief can be provided by introducing a non-conductive flowable material into the tubular element in lieu of the strain relief bar. This is then allowed to cure and harden around the cable, printed circuit board and resistors, thus providing the needed strain relief.

Accordingly, an object of the present invention is to provide a multi-conductor cable access assembly which is space efficient and which facilitates access to the conductors and electrical components connected thereto for the purpose of testing, replacement or repair.

Another object of the present invention is to provide a multi-conductor cable access assembly which facilitates the connection of a plurality of resistors or other electrical elements with the various conductors within the multi-conductor cable.

A further object of the present invention is to provide an improved conductor cable access assembly which includes a unique strain relief means.

Another object of the present invention is to provide a multi-conductor cable access assembly which includes an elongated section of printed circuit board for the purpose of mounting a plurality of resistors or other electrical elements and interconnecting the same with the various conductors of the multi-conductor cable.

These and other objects of the present invention will become apparent with reference to the drawings, the description of the preferred embodiment and the appended claims.

DESCRIPTION OF THE PREFERRED EMBODIMENT

Figure 1:
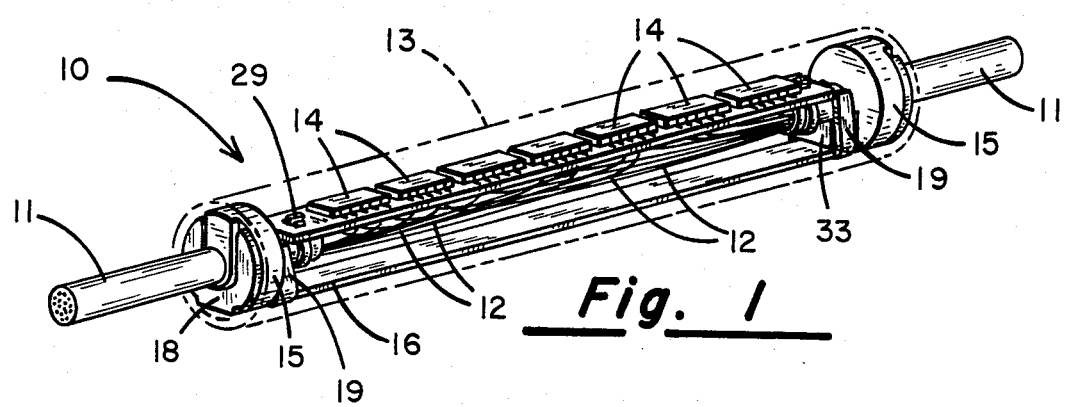
FIG. 1 is a pictorial view of the multi-conductor cable access assembly of the present invention with the exterior tubing illustrated in phantom.

As illustrated best in FIG. 1, the device of the present invention is illustrated generally by the reference numeral 10. The device 10 is designed for use in connection with a multi-conductor cable 11 having a plurality of individual conductors 12. In the preferred embodiment, these conductors 12 are connected with a plurality of individual resistors which are embodied within the resistor units 14. The device 10 also includes a pair of generally disk-shaped end elements 15 mounted in spaced relationship along the multi-conductor cable 11. Connected to, and extending between, these disk-shaped elements 15 is a structurally rigid, strain relief bar 16 having a pair of spaced apart yoke members 18 and 19 at each of its ends for connection with the end members 15. As is illustrated, the members 19 are crimped over the wire to prevent twisting of the wire as well as longitudinal movement relative to the strain relief bar 16. A tubular member 13 which is illustrated in phantom in FIG. 1 slips over and encloses the entire structure.

Figure 8:
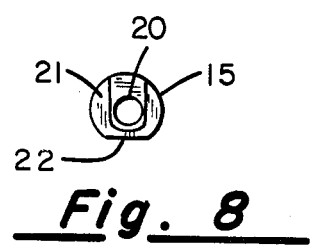
FIG. 8 is an elevational end view of one of the end members.
Figure 9:
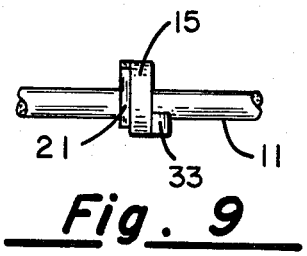
FIG. 9 is an elevational side view of one of the end members with the multi-conductor cable extending through its center opening.
Figure 10:
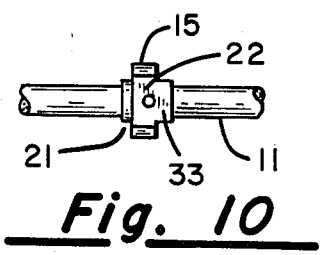
FIG. 10 is an elevational bottom view of one of the end members with the multi-conductor cable extending through its center opening.

As more specifically illustrated in FIGS. 8, 9 and 10, each of the end elements 15 is a generally disk-shaped element having a centrally located opening 20 which permits the element 15 to be slipped over the multi-conductor cable 11. As illustrated in FIG. 8, the opening 20 is generally circular and has a dimension which permits it to have a relatively snug fit with respect to the exterior surface of the cable 11. One side face of the end member 15 includes a generally "c" shaped recessed portion 21 which is intended to receive a corresponding "c" shaped yoke member of the strain relief bar 16 (FIG. 1). The end member 15 also includes a flattened bottom surface 22 to provide a cooperating surface for engagement by a portion of the strain relief bar 16 and a short cable support portion 33 integrally formed with the side of the end member 15 opposite the portion 21. The portion 33 supports the cable 11 when the members 19 are crimped around the cable 11. In the preferred embodiment, the end members 15 are constructed of a non-conductive plastic material, although other similar materials can also be used.

Figure 2:
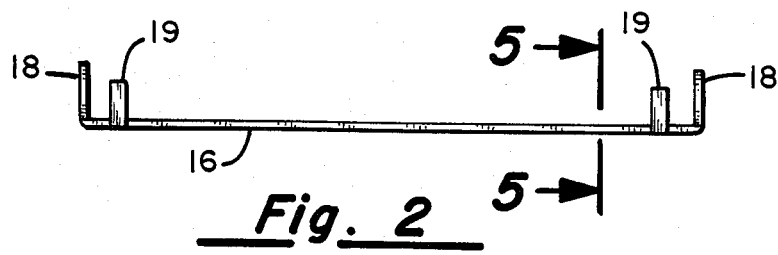
FIG. 2 is an elevational side view of the rigid, elongated strain relief bar of the device of the present invention.
Figure 4:
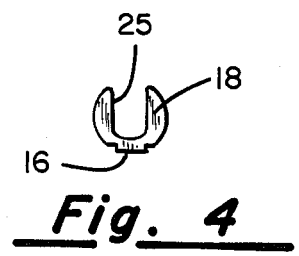
FIG. 4 is an elevational end view of the strain relief bar shown in FIG. 2.
Figure 3:
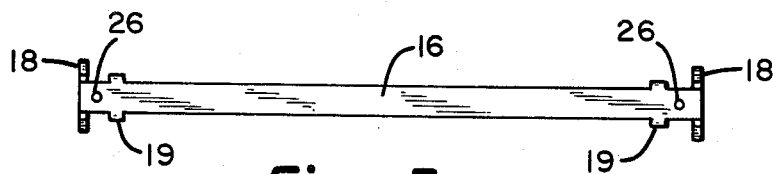
FIG. 3 is an elevational bottom view of the elongated strain relief bar illustrated in FIG. 2.
Figure 5:
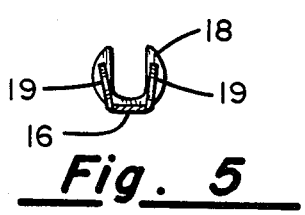
FIG. 5 is a view, partially in section, of the strain relief bar as viewed along the section line 5—5 of FIG. 2.
Figure 6:
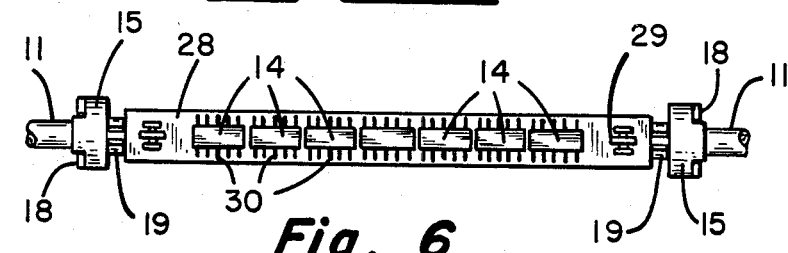
FIG. 6 is an elevational top view of the multi-conductor cable access assembly of the present invention with the external tubular element removed.

The details of the elongated strain relief bar 16 are illustrated best in FIGS. 2-5. As shown, the strain relief bar 16 includes an elongated, narrow and flat center section with a pair of spaced apart yoke members 18 and 19 integrally formed with the central section of each end. As illustrated in FIGS. 4 and 5, the end yoke member 18 is integrally formed with the end of the central section of the bar 16 and has a pair of tabs extending from the bar 16 on opposite sides of the cable 11 (FIG. 6). The tabs of the yoke member 18 are laterally spaced from each other and form a generally "c" shaped configuration with an internal opening 25. The yoke member 18 together with the opening 25 is designed to cooperatively engage the recessed "c" shaped portion 21 of a corresponding end member 15 in the manner illustrated in FIG. 1. The yoke member 19 is best illustrated in FIGS. 2, 3 and 5 and also comprises a pair of tab members spaced laterally from each other and integrally formed with and extending upwardly from the central portion of the bar 16. The pair of tabs which form the yoke member 19 are also disposed on opposite sides of the multi-conductor cable 11 when the device is fully assembled and are crimped together to hold the cable securely. As illustrated best in FIGS. 6 and 7, the pair of yoke members 18 and 19 at each end of the strain relief bar 16 are spaced from each other along the longitudinal direction of the cable 11 a distance which approximates the thickness of the main portion of the end member 15. Thus, each pair of the yoke members 18 and 19 straddles its respective end member 15 with the "c" shaped yoke member 18 cooperatively engaging the corresponding "c" shaped recessed portion 21 and the tabs 19 crimped around the cable 11. With this engagement, the strain relief bar 16 and the end members 15 are prevented from relative rotational movement and also relative longitudinal movement along the cable 11.

Although the strain relief bar 16 can be constructed of a variety of different materials, the material must be structurally rigid enough to suit the strain relief purpose of the present device. Further, the material must be rigid enough so that the tabs of the yoke members 18 and 19 function to retain the end members 15 while still allowing the tabs 19 to be crimped in the manner contemplated. In the preferred embodiment, the bar 16 is constructed of cold rolled steel.

Figure 7:
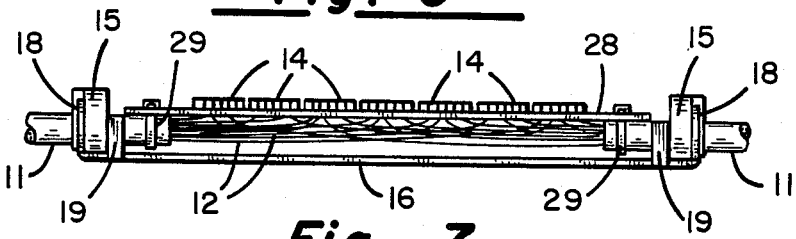
FIG. 7 is an elevational side view of the multi-conductor cable access assembly of the present invention with the external tubular element removed.

With reference to FIGS. 1, 6 and 7, the device of the present invention also includes a panel member or other mounting means disposed between the end members 15 and connected near its ends to portions of the multi-conductor cable 11. In the preferred embodiment this panel member includes an elongated section of printed circuit board 28 which is connected near each of its ends to a portion of the multi-conductor cable 11. In the preferred embodiment, this connection is made by a conventional connecting strap 29 which extends around the cable 11 and through appropriate openings in the printed circuit board section 28. The printed circuit board 28 includes a plurality of electrical connector units 14 mounted on the section 28 in a conventional manner. In the preferred embodiment, these units 14 are resistor units although it is contemplated that they could embody other electrical elements or components as well. Each of the units 14 includes a plurality of resistor elements 30 having contact portions available for connection with the individual conductors 12 of the multi-conductor cable 11. As shown best in FIGS. 1 and 7, the individual conductors 12 from one end of the multi-conductor cable 11 are electrically connected with one side of the electrical contact of the various resistor elements 30. The corresponding other end of the individual conductors 12 from the other end of the multi-conductor cable 11 is then electrically connected to the corresponding other contact of the resistor elements 30. Although the preferred embodiment shows the electrical elements mounted to a section of printed circuit board 28, it is contemplated that the electrical elements or resistors could simply be electrically connected between corresponding ends of an individual conductor 12, thus eliminating the panel member or similar structure completely.

Figure 11:
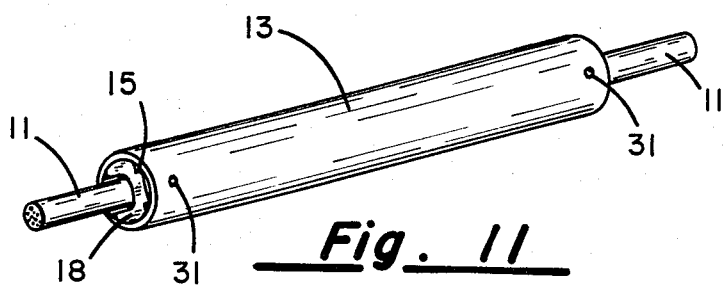
FIG. 11 is a pictorial view showing the device of the present invention in its fully assembled form.

As illustrated in phantom in FIG. 1 and fully in FIG. 11, a generally tubular element 13 is slipped over the multi-conductor cable 11 to enclose the entire assembly. In the preferred embodiment, the tubular element 13 is constructed of a non-conductive plastic material and has an internal dimension approximating the external dimension of the end elements 15. This permits the tubular member 13 to slide over the end elements and the other elements disposed therebetween. The tubular member 13 is connected with the elongated strain relief bar 16 by a threaded member 31 extending through corresponding openings in the tube 13 and into the threaded openings 26 in the strain relief bar 16.

In an alternate embodiment, where access to the elements is not needed or desired, the strain relief can be provided by introducing a flowable, non-conductive material into the tubular element so that it surrounds the cable 11, the printed circuit board section 28 and the resistor 30. The material is then allowed to harden, thus providing the strain relief.

Having described the structural details of the present invention, the use and operation of the same can be understood as foolows. First, a multi-conductor cable 11 is cut and one of the end elements 15 is slipped over each end. Then the insulation is stripped back so as to expose a sufficient length of the individual conductor elements 12 within the cable 11. The strain relief bar 16 is then connected to the end elements as illustrated in FIG. 1. Following this, the individual conductors 12 are connected with the appropriate contacts of the individual resistor elements 30, after which the printed circuit board section 28 is secured to opposite ends of the cable 11 by the connector straps 29. The tabs 19 are then crimped around the cable 11, to secure the cable 11 to the strain relief member 16. When this is completed, the tubular element 13 is slipped over the entire device and the threaded members 31 are inserted. In the event access is desired to the interior of the device for the purpose of changing, repairing or testing one of the resistors or other electrical elements 30, the threaded members 31 are removed and the tubular member 13 slipped off.

Although the description of the preferred embodiment has been quite specific, it is contemplated that various changes could be made to the device without deviating from the spirit of the present invention. Accordingly, it is contemplated that the scope of the present invention be dictated by the appended claims rather than by the description of the preferred embodiment.

We claim:

1. A multi-conductor cable access member comprising:
   a pair of spaced apart end elements each having an opening extending therethrough to accommodate a multi-conductor cable;
   an elongated, relatively rigid relief bar extending between said spaced apart end elements;
   means for connecting said strain relief bar with each of said end elements to prevent relative rotational and longitudinal movement between each of said end elements and said strain relief bar; and
   a tubular member enclosing said end members and said strain relief bar.

2. A multi-conductor cable access assembly comprising:
   a pair of end elements each having an opening through which a multi-conductor cable extends, said end elements being spaced apart along said multi-conductor cable;
   an elongated strain relief bar extending between said spaced apart end elements;
   means for connecting said strain relief bar with each of said end elements to prevent relative rotational and longitudinal movement between each of said end elements and said strain relief bar, said means including a pair of spaced apart yoke members at each end of said strain relief bar, said yoke members in each of said pairs of yoke members straddling a corresponding one of said end elements; and
   a tubular member enclosing said end members and said strain relief bar.

3. The access member of claim 2 wherein each of said yoke members includes a pair of tabs extending from said strain relief bar on opposite sides of said multi-conductor cable.

4. The access member of claim 3 wherein the tabs of one of said yoke members are crimped together around said multi-conductor cable.

5. The access member of claim 2 wherein each of said pair of end elements includes a recessed portion on one side engaged by one of said yoke members of a corresponding pair of yoke members.

6. The access member of claim 5 wherein each of said end elements is generally disk-shaped and said recessed portion is on one side surface thereof.

7. The access member of claim 3 wherein each of said pair of end elements includes a recessed portion on one side engaged by the tabs of one of said yoke members of a corresponding pair of yoke members.

8. The access member of claim 7 wherein each of said end elements includes a flattened edge portion engaged with a portion of said strain relief bar.

9. The access member of claim 1 including means for connecting said tubular member to said strain relief bar.

10. The access member of claim 1 including an elongated mounting member disposed between said end members and adapted for connection near its ends to portions of a multi-conductor cable.

11. The access member of claim 10 including a plurality of electrical elements mounted on said elongated mounting member.

12. The access member of claim 11 wherein said elongated mounting member is a section of printed circuit board.

13. The access member of claim 12 wherein said electrical elements are resistors.

14. The access member of claim 13 wherein said section of printed circuit board is adapted for connection to a multi-conductor cable by a pair of straps extending through openings therein.

15. The access member of claim 1 wherein said opening in each of said end elements conforms substantially to the size and cross-sectional configuration of the multi-conductor cable for which access is being provided.

16. The access member of claim 15 including means for securing each of said end elements and strain relief bar to a multi-conductor cable to prevent rotational and longitudinal movement relative to the cable.

17. The access member of claim 1 wherein said means for connecting said strain relief bar with each of said end elements includes at least one yoke member at each end of said strain relief bar, each of said yoke members cooperating with a corresponding one of said end elements to prevent relative rotational movement between said end element and said strain relief bar.

18. The access member of claim 17 wherein said means for connecting said strain relief bar with each of said end elements includes first and second yoke members near each end of said strain relief bar, said first and second yoke members being spaced from each other to straddle said corresponding end member.

19. The access member of claim 17 wherein each of said end elements includes a recessed portion on one side for engagement by a corresponding yoke member.

20. The access member of claim 19 wherein each of said yoke members includes a pair of tabs and each of said end elements is generally disc shaped and includes recessed portions on one side for engagement by said tabs of a corresponding yoke member.

21. The access member of claim 20 wherein each of said end elements includes a flattened edge portion for engagement with a portion of said strain relief bar.

22. A multi-conductor access member comprising:
an elongated strain relief bar connected at spaced apart points to a multi-conductor cable;
an elongated section of printed circuit board connected near its ends to portions of the multi-conductor cable at points between the points of connection between said elongated strain relief bar and the multi-conductor cable;
a plurality of resistor elements mounted on said elongated section of printed circuit board; and
a tubular member connected with said strain relief bar and enclosing said strain relief bar, said section of printed circuit board and said plurality of resistor elements.

23. The access member of claim 22 wherein said strain relief bar is relatively rigid.

24. The access member of claim 23 wherein said strain relief bar is constructed from a rigid metal.

* * * * *